United States Patent
Guidash

(10) Patent No.: US 8,178,938 B2
(45) Date of Patent: *May 15, 2012

(54) ACTIVE PIXEL SENSOR HAVING TWO WAFERS

(75) Inventor: Robert M. Guidash, Rochester, NY (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/051,036

(22) Filed: Mar. 18, 2011

(65) Prior Publication Data

US 2011/0163223 A1 Jul. 7, 2011

Related U.S. Application Data

(62) Division of application No. 11/867,199, filed on Oct. 4, 2007, now Pat. No. 8,049,256.

(60) Provisional application No. 60/828,259, filed on Oct. 5, 2006.

(51) Int. Cl.
*H01L 31/0232* (2006.01)

(52) U.S. Cl. .................. 257/432; 257/E31.128
(58) Field of Classification Search .................. 257/290, 257/291, 292, 239, 432, 232, E27.133, E31.128, 257/81, 98, 99, 100, 433–435, 749, 680; 250/280.1, 214 R, 214.1; 348/246, 294, 348/296, 272, 277
See application file for complete search history.

(56) References Cited

U.S. PATENT DOCUMENTS

| | | | | |
|---|---|---|---|---|
| 6,927,432 | B2 * | 8/2005 | Holm et al. | 257/290 |
| 7,329,555 | B1 * | 2/2008 | Padmanabhan et al. | 438/51 |
| 7,382,008 | B2 * | 6/2008 | Xu | 257/291 |
| 7,570,810 | B2 * | 8/2009 | Rai et al. | 382/167 |
| 2003/0209652 | A1 | 11/2003 | Fujii et al. | |
| 2005/0110094 | A1 * | 5/2005 | Kuwazawa | 257/359 |
| 2005/0139828 | A1 | 6/2005 | Maruyama et al. | |
| 2006/0055800 | A1 * | 3/2006 | Ackland et al. | 348/308 |
| 2007/0069258 | A1 | 3/2007 | Ahn | |
| 2008/0079030 | A1 * | 4/2008 | Hsu et al. | 257/225 |
| 2008/0251823 | A1 | 10/2008 | Lee | |

FOREIGN PATENT DOCUMENTS

| | | |
|---|---|---|
| EP | 0 757 476 | 2/1997 |
| EP | 1 453 097 | 9/2004 |
| JP | 2001339057 | 12/2001 |
| JP | 2005353994 | 12/2005 |

OTHER PUBLICATIONS

"Intelligent Image Sensor Chip with Three Dimensional Structure" by H. Kurino et al., Electron Devices Meeting, 1999, IEDM Technical Digest, pp. 879-882, XP010372201.

* cited by examiner

*Primary Examiner* — Hoa B Trinh
(74) *Attorney, Agent, or Firm* — Blakely Sokoloff Taylor & Zafman LLP

(57) ABSTRACT

A vertically-integrated active pixel sensor includes a sensor wafer connected to a support circuit wafer. Inter-wafer connectors or connector wires transfer signals between the sensor wafer and the support circuit wafer. The active pixel sensor can be fabricated by attaching the sensor wafer to a handle wafer using a removable interface layer. Once the sensor wafer is attached to the handle wafer, the sensor wafer is backside thinned to a given thickness. The support circuit wafer is then attached to the sensor wafer and the handle wafer separated from the sensor wafer.

10 Claims, 9 Drawing Sheets

ACTIVE PIXEL SENSOR HAVING TWO WAFERS

CROSS REFERENCE TO RELATED APPLICATIONS

This is a divisional application of U.S. application Ser. No. 11/867,199 filed Oct. 4, 2007 now U.S. Pat. No. 8,049,256. Reference is made to and priority claimed from U.S. Provisional Application Ser. No. 60/828,259, filed Oct. 5, 2006, entitled ADVANCED CMOS IMAGE SENSOR TECHNOLOGY (AKA SENSOR ON TOP).

TECHNICAL FIELD

The invention relates generally to the field of active pixel sensors, and more particularly to active pixel sensors having two separate semiconductor wafers with each wafer including a portion of the electrical circuitry.

BACKGROUND

CMOS Image sensors (CIS) suffer from the issue that deeply scaled sub-micron Complementary Metal Oxide Semiconductor (CMOS) processes are required to realize small pixels that can compete with charge-coupled device (CCD) pixel sizes. In general, as the CMOS processes scale to smaller dimensions, the details of the process integration and structure change, and the pixel performance degrades. Some examples of this are shallow trench isolation, and heavily doped retrograde wells. Both are necessary to build deep sub-micron CMOS devices, but both have adverse effects on dark current for pixels. As a result, much work has to be done to re-integrate and re-optimize the photodetector and pixel into each new deep sub-micron CMOS technology node.

Designers, however, face a trade-off with respect to the design and manufacture of sub-micron CMOS devices. Designers can either maintain pixel image quality by not moving to more scaled CMOS processes, which results in a lower fill factor for smaller pixels, or move to a smaller design rule process to achieve small pixels, which results in a need to re-integrate and re-engineer the photodetector to obtain acceptable image quality.

One solution to these issues is to build the photodetector separately from the CMOS circuits. The image sensor, for example, can be built on different wafers, and the wafers joined together using three-dimensional integration or wafer level interconnect technologies. U.S. Pat. No. 6,927,432 fabricates an active pixel sensor using two semiconductor wafers. One wafer, the donor wafer, includes the photodetectors while another wafer, the host wafer, includes an interconnect layer and electrical circuits for in-pixel signal operations and read out of the photodetectors. Pixel interconnects directly connect each photodetector on the donor wafer to a respective node or circuit on the host wafer.

Although this approach separates the processing of the photodetector and circuits, it degrades photodetector performance due to the direct contact or connection with the photodetector. Specific examples of such performance degradation include, but are not limited to, increased dark current due to damage from the contact etch process, increased metallic contamination in the photodetector leading to point defects, and high dark current due to being connected to a highly doped ohmic contact region.

SUMMARY

An active pixel sensor includes two semiconductor wafers, a sensor wafer connected to a support circuit wafer. The sensor wafer can be implemented as a front-side illuminated sensor wafer or a back-side illuminated sensor wafer. In one embodiment in accordance with the invention, the sensor wafer includes an array of pixel regions, with each pixel region including a photodetector, a transfer gate, and a charge-to-voltage conversion mechanism. The sensor wafer can also include an interconnect layer that provides one or more conductive interconnects.

The support circuit wafer includes an interconnect layer and a CMOS device layer. The CMOS device layer includes support circuitry for the active pixel sensor. The types of components and circuits used in the CMOS device layer depend on the purpose or use of the active pixel sensor. The support circuitry can be included in each pixel region on the support circuit wafer and utilized only by a respective pixel region on the sensor wafer. Alternatively, two or more pixel regions can share some or all of the support circuitry on the sensor wafer. Inter-wafer connectors connect the charge-to-voltage conversion mechanism in each pixel region on the sensor wafer to a respective node or circuit on the support circuit wafer. The inter-wafer connectors transfer charge from the charge-to-voltage conversion mechanism to the support circuit wafer.

In another embodiment in accordance with the invention, each pixel region on the sensor wafer includes a photodetector, readout circuitry, and conductive interconnects (attendant wires and contacts). One example of the readout circuitry is a transfer gate, a charge-to-voltage conversion mechanism, and one or more transistors connected to the charge-to-voltage mechanism. Other embodiments in accordance with the invention can implement the sensor wafer using different pixel architectures.

The support wafer includes conductive interconnects and additional analog and digital circuits used by the active pixel sensor. Examples of the additional circuits formed on the support circuit wafer include, but are not limited to, timing generators, control circuitry such as transfer gate drivers, decoders, output circuits, and power supplies. Inter-wafer connector wires connect the outputs of some support circuitry on the support circuit wafer, such as, for example, timing and bias circuits, to the inputs on the sensor wafer. Inter-wafer connector wires also connect the outputs of the sensor wafer to the inputs of some support circuitry on the support circuit wafer, such as, for example, readout circuits.

A method for fabricating an active pixel sensor having a sensor wafer and a support circuit wafer includes attaching the sensor wafer to a handle wafer using a removable interface layer. The removable interface layer includes, but is not limited to, an organic or polymer interface layer. A protective layer analogous to that used in Chip Scale Packaging can be applied over the sensor wafer when the backside thinning process is performed after color filter array and microlenses processing. The handle wafer is then attached to the top of the protective layer using an organic or polymer interface layer.

Once the sensor wafer is attached to the handle wafer, the sensor wafer is backside thinned to a given thickness. The support circuit wafer is then attached to the sensor wafer. Once the support circuit wafer is attached to the sensor wafer, the handle wafer is separated from the sensor wafer. Chemical processing to dissolve the organic or polymer interface layer can be used to separate the handle wafer from the sensor wafer.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention includes the advantages of having both high image quality and high fill factor. The fabrication process for the sensor wafer can be optimized for photodetector performance while the fabrication process for the support circuit wafer can be optimized for CMOS processing and circuit performance. The sensor wafer can be used with multiple support circuit wafer designs or technologies, thereby providing improved design flexibility and optimization along with reduced costs. The connection between the sensor wafer and the support circuit wafer can be achieved through the charge-to-voltage conversion mechanism on the sensor wafer, a voltage domain contact, and a node on the support circuit wafer, thereby avoiding performance degradation of the photodetectors.

DETAILED DESCRIPTION

Figure 1:
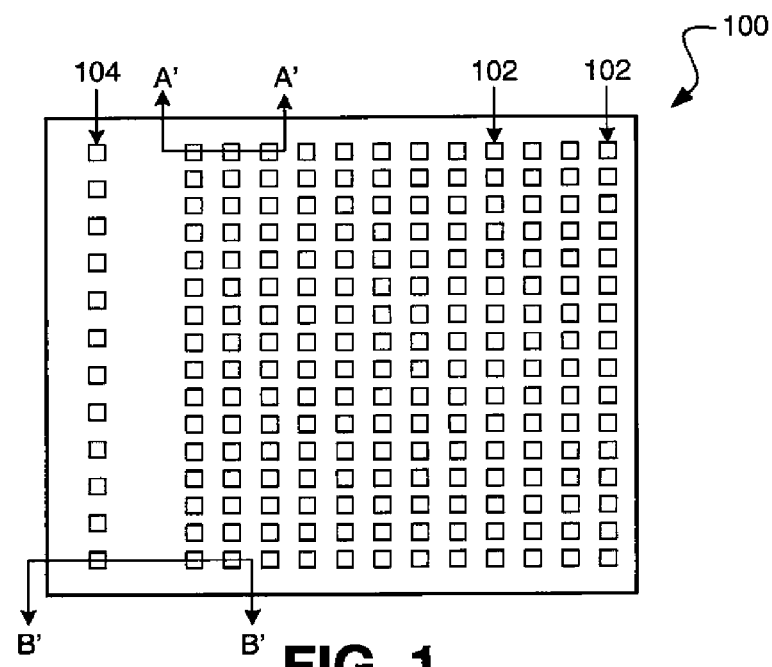
FIG. 1 is a top view of a sensor wafer included in an image sensor having two semiconductor wafers in an embodiment in accordance with the invention.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected, or an indirect connection through one or more passive or active intermediary devices. The term "circuit" means either a single component or a multiplicity of components, either active or passive, that are connected together to provide a desired function. The term "signal" means at least one current, voltage, or data signal. Referring to the drawings, like numbers indicate like parts throughout the views.

Referring now to FIG. 1, there is shown a top view of an image sensor having two semiconductor wafers in an embodiment in accordance with the invention. Image sensor 100 is implemented an active pixel sensor, such as, for example, a Complementary Metal Oxide Semiconductor (CMOS) image sensor. An active pixel sensor has pixels that each includes one or more active electrical components, such as transistors, within the pixel cell.

Image sensor 100 includes pixel regions 102 arranged in an array of rows and columns. Image sensor array 100 can have any number of pixels regions, such as, for example, 1280 columns by 960 rows of pixel regions. Perimeter inter-wafer connectors 104 are formed along one perimeter edge of image sensor 100 in an embodiment in accordance with the invention. Although inter-wafer connectors 104 are shown on only one perimeter edge of image sensor 100, other embodiments in accordance with the invention can include perimeter inter-wafer connectors 104 on two or more perimeter edges of image sensor 100.

Figure 2:
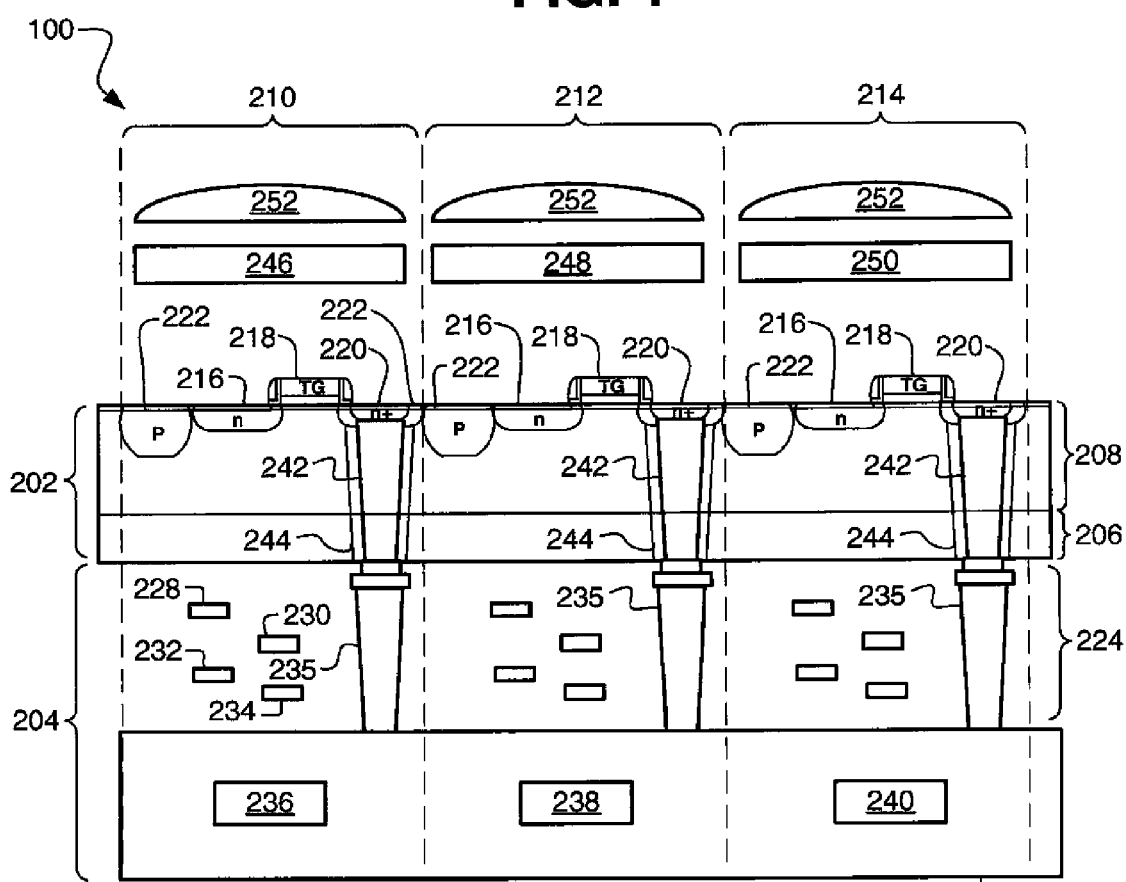
FIG. 2 is a cross-sectional view along line A'-A' in FIG. 1 in an embodiment in accordance with the invention.

FIG. 2 is a cross-sectional view along line A'-A' in FIG. 1 in an embodiment in accordance with the invention. Image sensor 100 includes sensor wafer 202 and support circuit wafer 204. Image sensor 100 is implemented as a front-side illuminated active pixel sensor. Sensor wafer 202 is implemented as a back-thinned CIS wafer having an n-type wafer layer 206 and a p-type epitaxial layer 208 in an embodiment in accordance with the invention.

Image sensor 100 includes pixel regions 210, 212, 214 on sensor wafer 202 and support circuit wafer 204. Each pixel region 210, 212, 214 on sensor wafer 202 includes photodetector 216, transfer gate 218, charge-to-voltage conversion mechanism 220, and isolation regions 222 to isolate photodetectors 216 and charge-to-voltage conversion mechanisms 220. Photodetector 216 is implemented as a pinned photodiode and charge-to-voltage conversion mechanism 220 as a floating diffusion in an embodiment in accordance with the invention. Photodetector 216 and charge-to-voltage conversion mechanism 220 can be implemented differently in other embodiments in accordance with the invention.

Support circuit wafer 204 includes interconnect layer 224 and CMOS device layer 226 in an embodiment in accordance with the invention. Interconnect layer 224 is formed with a dielectric material and is shown in FIG. 2 with four metal layers 228, 230, 232, 234. Interconnect layer 224 can include any number of metal layers in other embodiments in accordance with the invention. Inter-wafer connectors 235 are formed from a combination of metal layers 228, 230, 232, 234 in an embodiment in accordance with the invention. Each inter-wafer connector 235 is shown as a continuous region in FIG. 2 for ease of representation.

CMOS device layer 226 includes support circuitry 236, 238, 240 for pixel regions 210, 212, 214, respectively. Support circuitry 236, 238, 240 can be dedicated to each pixel region 210, 212, 214 or some or all of support circuitry 236, 238, 240 can be shared by two or more pixel regions 210, 212, 214. The types of components and circuits used in CMOS device layer 226 depend on the purpose or use of image sensor 100. By way of example only, CMOS device layer 226 includes a source follower transistor, a reset transistor, a row select transistor, and a supply voltage for each pixel region 210, 212, 214 in an embodiment in accordance with the invention. CMOS device layer 226 includes additional or different analog and digital circuits in other embodiments in accordance with the invention. Examples of such analog and digital circuits include, but are not limited to, row and column decoders and drivers, per column sample and hold circuits, analog signal processing chains, digital image processing blocks, memory, timing and control circuits, input/output (I/O), and bond pads.

Inter-wafer connectors 242 electrically connect each charge-to-voltage conversion mechanism 220 on sensor wafer 202 to a respective node or circuit on support circuit wafer 204 via inter-wafer connectors 235. Inter-wafer connectors 242 are electrically isolated from the other regions in sensor wafer 202 by isolation 244. Isolation 244 is implemented as any non-conductive material, such as, for example, silicon dioxide.

Color filters 246, 248, 250 are formed over sensor wafer 202 and are used to filter the bandwidth of incident light received by each photodetector 216. By way of example only, color filter 246 is configured such that light propagating at or near the red spectrum is received by photodetector 216. Color filter 248 is configured so that light propagating at or near the green spectrum is received by photodetector 216. And color filter 250 allows only light propagating at or near the blue spectrum is received by the photodetector 216. Color filters 246, 248, 250 combined form a color filter array. Microlenses 252 are formed over color filters 246, 248, 250 and are used to direct light towards photodetectors 216.

Figure 3:
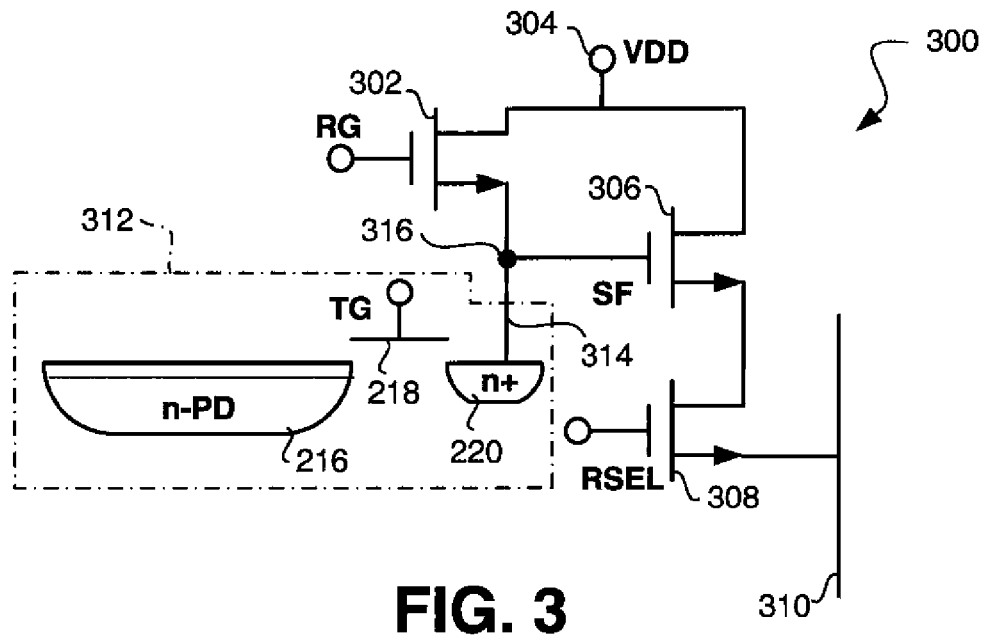
FIG. 3 is a schematic diagram of an active pixel that can be implemented in an image sensor having two semiconductor wafers in an embodiment in accordance with the invention.

Referring now to FIG. 3, there is shown a schematic diagram of an active pixel that can be implemented in an image sensor having two semiconductor wafers in an embodiment in accordance with the invention. Active pixel 300 includes photodetector (PD) 216, transfer gate (TG) 218, charge-to-voltage conversion mechanism 220, reset gate transistor (RG) 302, potential $V_{DD}$ 304, source follower amplifier transistor (SF) 306, and row select transistor (RSEL) 308, whose drain is connected to the source of SF 306 and whose source is connected to output 310. The drains of RG 302 and SF 306 are maintained at potential $V_{DD}$ 304. The source of RG 302 and the gate of SF 306 are connected to charge-to-voltage conversion mechanism 220.

Dashed lines 312 surround photodetector 216, transfer gate 218, and charge-to-voltage conversion mechanism 220 to delineate the components included on sensor wafer 202. Reset gate transistor 302, potential $V_{DD}$ 304, source follower amplifier transistor 306, row select transistor 308, and output 310, which are not surrounded by dashed lines 312, represent the components formed on support circuit wafer 204 in an embodiment in accordance with the invention. Inter-wafer connector 314, which is formed with inter-wafer connector 242 and inter-wafer connector 235 (FIG. 2), electrically connects charge-to-voltage conversion mechanism 220 on sensor wafer 202 to node 316 on support circuit wafer 204.

Figure 4:
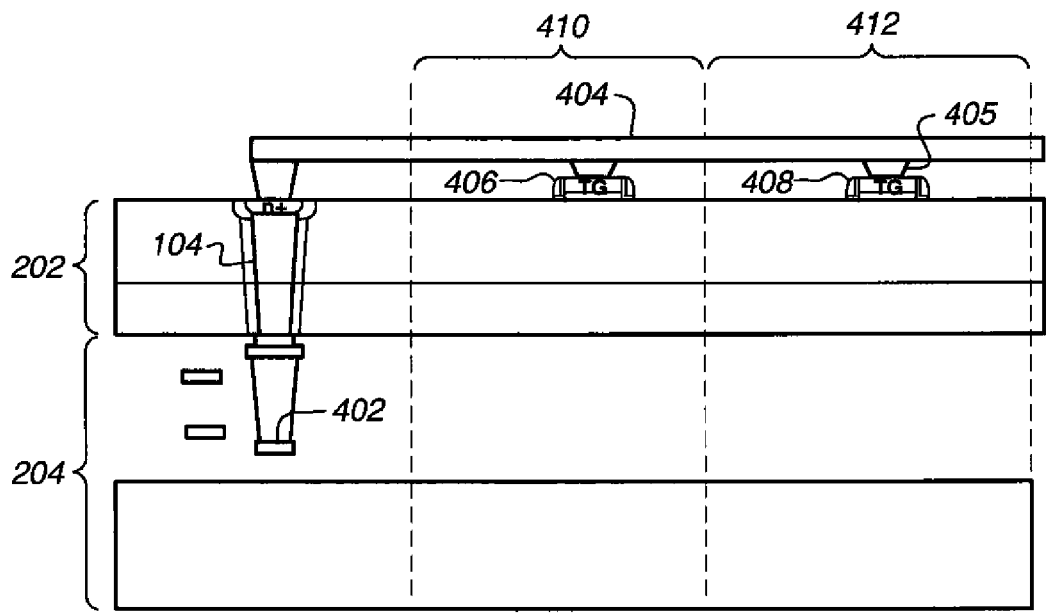
FIG. 4 is a cross-sectional view along line B'-B' in FIG. 1 in an embodiment in accordance with the invention.

FIG. 4 is a cross-sectional view along line B'-B' in FIG. 1 in an embodiment in accordance with the invention. Perimeter inter-wafer connector 104 electrically connects an output of the transfer gate driver 402 on support circuit wafer 204 to transfer gate interconnect 404. Transfer gate interconnect 404 connects to transfer gates 406, 408 in pixel regions 410, 412, respectively, on sensor wafer 202. The output of transfer gate driver 402 provides electrical signals to transfer gates 406, 408.

Figure 5:
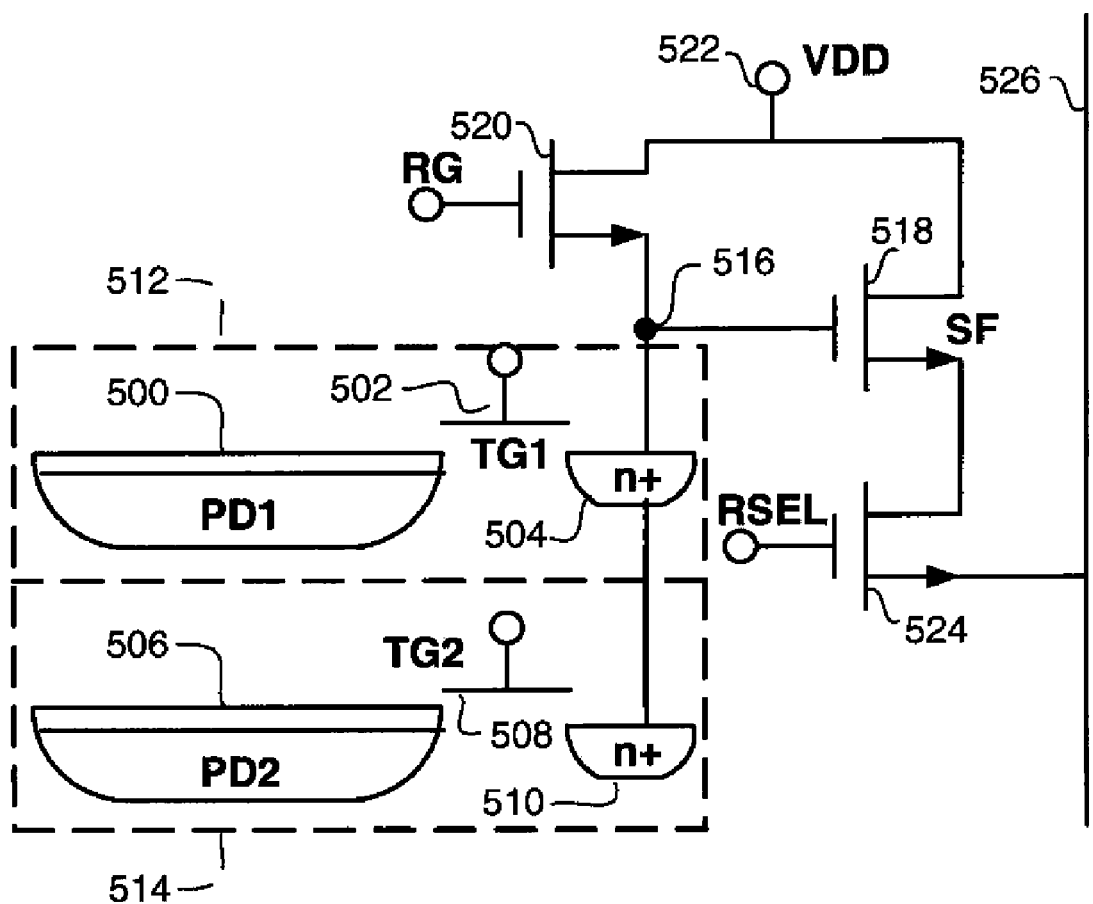
FIG. 5 is a schematic diagram of a shared amplifier architecture that can be implemented in an image sensor having two semiconductor wafers in an embodiment in accordance with the invention.

Referring now to FIG. 5, there is shown a schematic diagram of a shared amplifier architecture that can be implemented in an image sensor having two semiconductor wafers in an embodiment in accordance with the invention. An image sensor utilizing this architecture includes a sensor wafer with pixel regions that include photodetector (PD1) 500, transfer gate (TG1) 502, charge-to-voltage conversion mechanism (n+) 504, photodetector (PD2) 506, transfer gate (TG2) 508, and charge-to-voltage conversion mechanism (n+) 510. Photodetector (PD1) 500, transfer gate (TG1) 502, and charge-to-voltage conversion mechanism (n+) 504 are associated with pixel region 512 while photodetector (PD2) 506, transfer gate (TG2) 508, and charge-to-voltage conversion mechanism (n+) 510 are associated with pixel region 514. Although only two pixel regions 512, 514 are shown in FIG. 5, an image sensor includes multiple pixel regions in an embodiment in accordance with the invention.

Both charge-to-voltage conversion mechanisms 504, 510 on the sensor wafer are connected electrically to node 516 on the support circuit wafer using one inter-wafer connector (i.e., 235, 242) in an embodiment in accordance with the invention. Node 516 connects to the gate of source follower amplifier transistor (SF) 518 and the source of reset gate transistor (RG) 520. The drains of RG 520 and SF 518 are maintained at voltage potential $V_{DD}$ 522. The source of SF 518 is connected to the drain of row select transistor (RSEL) 524 and the source of RSEL 524 is connected to output ($V_{out}$) 526.

Figure 6:
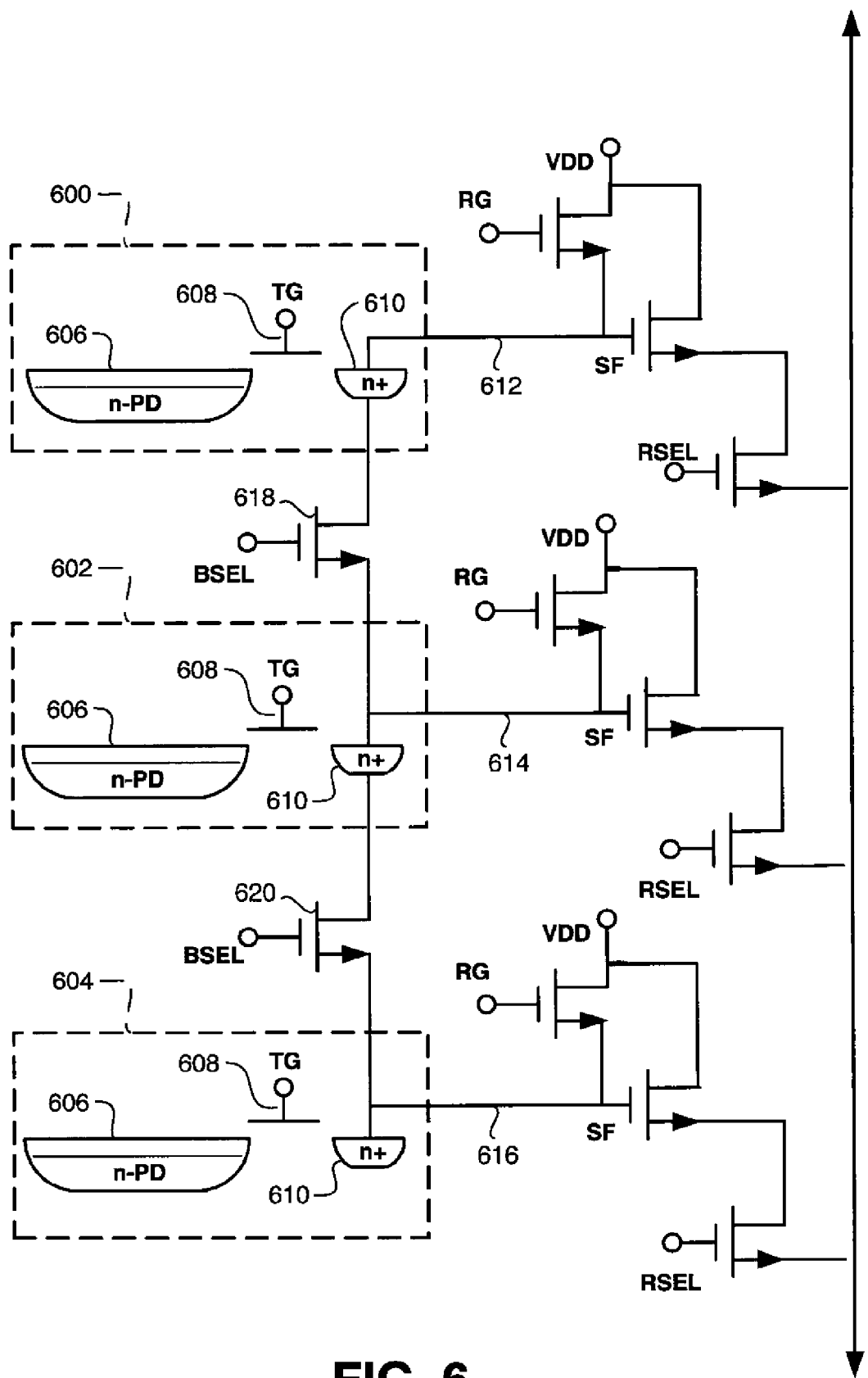
FIG. 6 is a schematic diagram of another pixel architecture that can be implemented in an image sensor having two semiconductor wafers in an embodiment in accordance with the invention.

FIG. 6 is a schematic diagram of another pixel architecture that can be implemented in an image sensor having two semiconductor wafers in an embodiment in accordance with the invention. An image sensor utilizing this architecture includes a sensor wafer with pixel regions 600, 602, 604. Although only three pixel regions 600, 602, 604 are shown in FIG. 6, an image sensor includes multiple pixel regions in an embodiment in accordance with the invention. Each pixel region 600, 602, 604 includes photodetector 606, transfer gate 608, and charge-to-voltage conversion mechanism 610. Photodetector 606, transfer gate 608, and charge-to-voltage conversion mechanism 610 are included on a sensor wafer.

Each pixel region on the support circuit wafer includes a source follower transistor (SF), a reset gate transistor (RG), and a row select transistor (RSEL) in an embodiment in accordance with the invention. Inter-wafer connectors 612, 614, 616 connect each charge-to-voltage conversion mechanism 610 on the sensor wafer to the gate of a respective source follower transistor on the support circuit wafer. A bin select transistor (BSEL) 618, 620 is also included on the support circuit wafer and selectively connects the charge-to-voltage conversion mechanisms 610 of adjacent pixel regions together via additional inter-wafer connectors.

Figure 7:
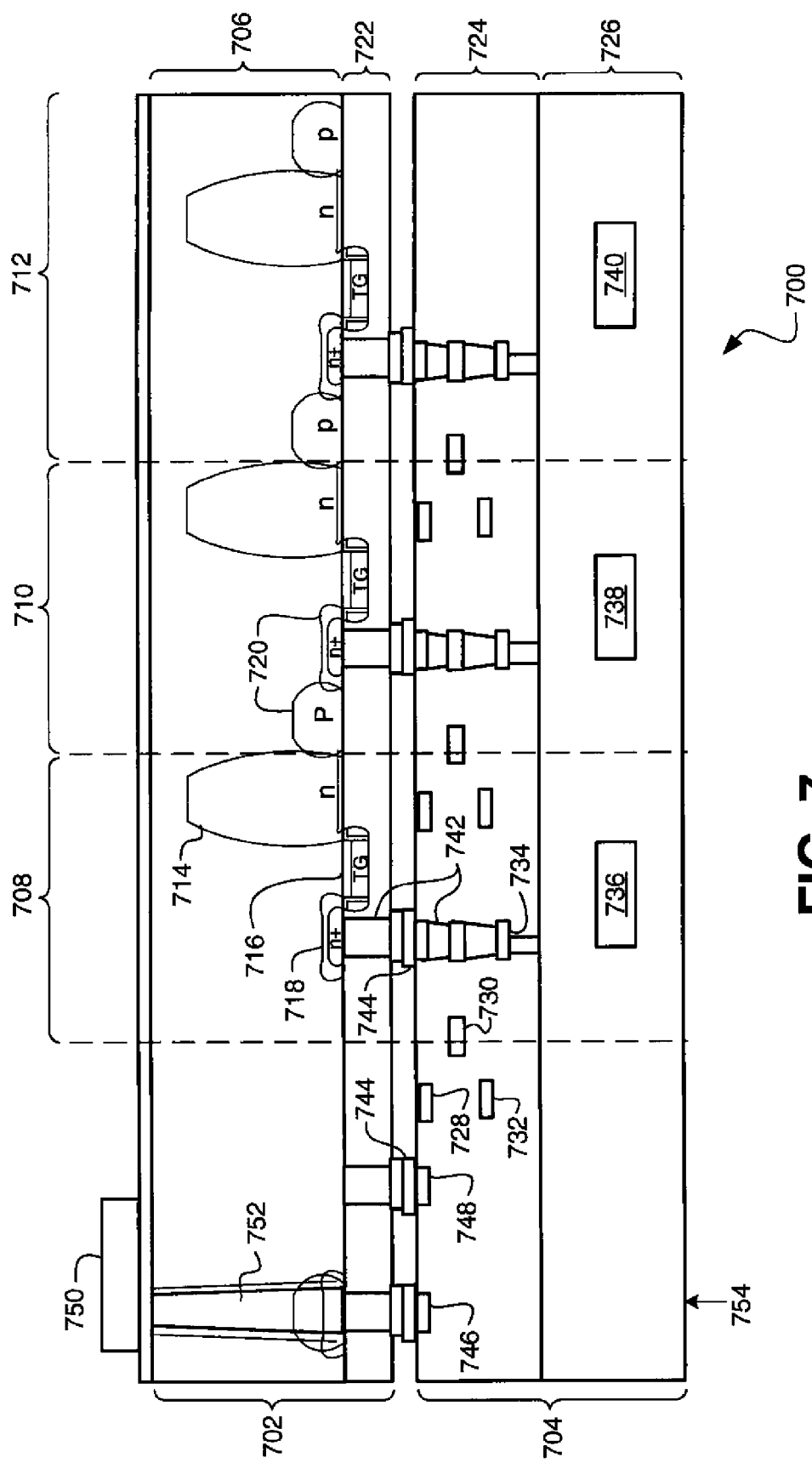
FIG. 7 is a cross-sectional view of a second image sensor having two semiconductor wafers in an embodiment in accordance with the invention.

Referring now to FIG. 7, there is shown a cross-sectional view of a second image sensor having two semiconductor wafers in an embodiment in accordance with the invention. Image sensor 700 includes sensor wafer 702 and support circuit wafer 704. Image sensor 700 is implemented as a back-side illuminated active pixel sensor. Sensor wafer 702 is implemented as a back-thinned wafer having an p-type epitaxial layer 706 and an interconnect layer 722 in an embodiment in accordance with the invention. Interconnect layer 722 includes the transfer gate wiring.

Image sensor 700 includes pixel regions 708, 710, 712 on sensor wafer 702 and support circuit wafer 704. Each pixel region 708, 710, 712 on sensor wafer 702 includes photodetector 714, transfer gate 716, charge-to-voltage conversion mechanism 718, and isolation regions 720 to isolate photodetectors 714 and charge-to-voltage conversion mechanisms 718. Photodetector 714 is implemented as a pinned photodiode and charge-to-voltage conversion mechanism 718 as a floating diffusion in an embodiment in accordance with the invention. Photodetector 714 and charge-to-voltage conversion mechanism 718 can be implemented differently in other embodiments in accordance with the invention.

Support circuit wafer 704 includes interconnect layer 724 and a CMOS device layer 726 in an embodiment in accordance with the invention. Interconnect layer 724 is formed with a dielectric material and is shown with four metal layers 728, 730, 732, 734. Interconnect layer 724 can include any number of metal layers in other embodiments in accordance with the invention.

CMOS device layer 726 includes support circuitry 736, 738, 740 for pixel regions 708, 710, 712, respectively. Support circuitry 736, 738, 740 can be dedicated to each pixel region 708, 710, 712 or some or all of support circuitry 736, 738, 740 can be shared by two or more pixel regions 708, 710, 712. The types of components and circuits used in CMOS device layer 726 depend on the purpose or use of image sensor 700. By way of example only, CMOS device layer 726 includes a source follower transistor, a reset transistor, a row select transistor, and a supply voltage for each pixel region 708, 710, 712 in an embodiment in accordance with the invention. CMOS device layer 726 can include additional or different analog and digital circuits in other embodiments in accordance with the invention. Examples of such analog and digital circuits include, but are not limited to, row and column decoders and drivers, per column sample and hold circuits, analog signal processing chains, digital image processing blocks, memory, timing and control circuits, input/output (I/O), and bond pads.

Inter-wafer connectors 742 are formed from metal layers provided in interconnect layers 722, 724 and electrically connect each charge-to-voltage conversion mechanism 718 on sensor wafer 702 with a respective node or circuit on support circuit wafer 704 using wafer-to-wafer contacts 744. Wafer-to-wafer contacts 744 are also formed from metal layers provided in interconnect layers 722, 724 in an embodiment in accordance with the invention. In another embodiment in accordance with the invention, wafer-to-wafer contacts 744 are formed from additional metal layers deposited or formed specifically for wafer level stacking and binding technology.

An input/output (I/O) connector 746 and an output for a transfer gate driver 748 are also included on support circuit wafer 704. Bond pad 750 connects to I/O connector 746 through inter-wafer connector 752. In other embodiments in accordance with the invention, bond pad 750 is formed on surface 754 of image sensor 700 and inter-wafer connector 752 is formed through support circuit wafer 704 to connect bond pad 750 to I/O connector 746.

Figure 8:
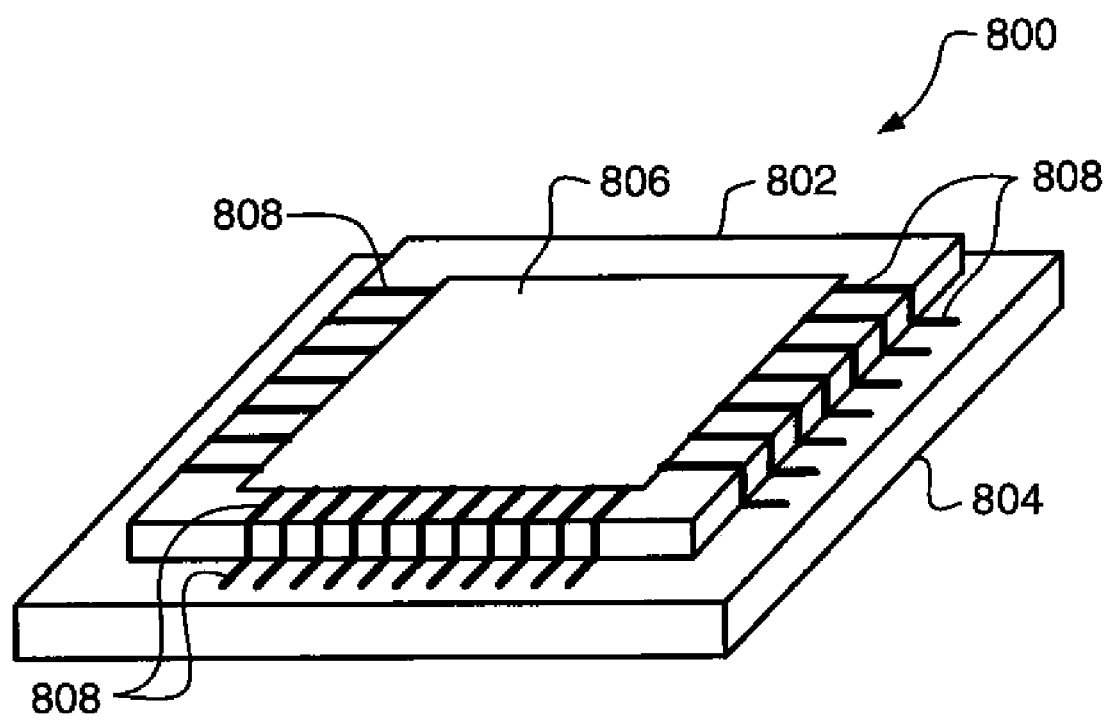
FIG. 8 is a perspective of a third image sensor having two semiconductor wafers in an embodiment in accordance with the invention.

FIG. 8 is a perspective of a third image sensor having two semiconductor wafers in an embodiment in accordance with the invention. Image sensor 800 can be a backside illuminated image sensor or a front side illuminated image sensor. Image sensor 800 includes sensor wafer 802 and support circuit wafer 804. Pixel array 806 is included on sensor wafer 802. Each pixel region in pixel array 806 includes a photodetector, transfer gate, charge-to-voltage conversion mechanism, and isolation regions for the photodetector and charge-to-voltage conversion mechanism (none shown) in an embodiment in accordance with the invention. The transfer gate, the charge-to-voltage conversion mechanism, and at least one transistor form the readout circuitry in an embodiment in accordance with the invention. Other embodiments in accordance with the invention can implement the readout circuitry differently using alternate pixel architectures.

Each pixel region can also include other pixel transistors and conductive interconnects, with each interconnect including conductive contacts and a conductive signal wire (not shown). Contact 405 in FIG. 4 is one example of a conductive contact and transfer gate interconnect 404 in FIG. 4 is one example of a conductive signal wire.

Support circuit wafer 804 includes additional analog and digital circuits (not shown) used by the active pixel sensor and conductive contacts. Examples of the additional circuits formed on support circuit wafer 804 include, but are not limited to, timing generators, control circuitry such as transfer gate drivers, decoders, output circuits, and power supplies. Electrical connections from sensor wafer 802 to support circuit wafer 804 are made at the perimeter edges of pixel array 806 using inter-wafer connector wires 808. Some inter-wafer connector wires 808 transmit input signals to sensor wafer 802 from support circuit wafer 804. For example, control and timing signals are transmitted to the pixel regions in pixel array 806. As another example, the outputs of the transfer gate drivers on support circuit wafer 804 are connected to corresponding transfer gate interconnect wires on sensor wafer 802 using one or more signal wires 808.

Other inter-wafer connector wires 808 transmit output signals from sensor wafer 802 to support circuit wafer 804. Column output wires on sensor wafer 802 are connected to corresponding inputs to the column circuits (not shown) on support circuit wafer 804 using one or more inter-wafer connector wires 808 in an embodiment in accordance with the invention. Although FIG. 8 shows wafer to wafer interconnects located at the periphery of the device, other embodiments in accordance with the invention can distribute these interconnections throughout the area of each device.

The electrical connections between sensor wafer 802 and support circuit wafer 804 can be made either at the die level or at a wafer level using known interconnect techniques. Examples of such techniques include, but are not limited to, die to die wire bonding, chip scale packaging of sensor wafer 802 with distributed back-side bumps to connect to top side pads on support circuit wafer 804, and through wafer-via technology. One example of through wafer-via technology is inter-wafer connector 104 in FIG. 4.

The pixel transistors on sensor wafer 802 are a single type of pixel transistors, such as NMOS or PMOS transistors, in an embodiment in accordance with the invention. Moreover, sensor wafer 802 typically includes only one or two conductive interconnect layers while the support circuit wafer 804 includes multiple conductive interconnect layers. This simplifies the fabrication process for sensor wafer 802 and allows the process to be optimized separately from the fabrication process for support circuit wafer 804.

Figure 9:
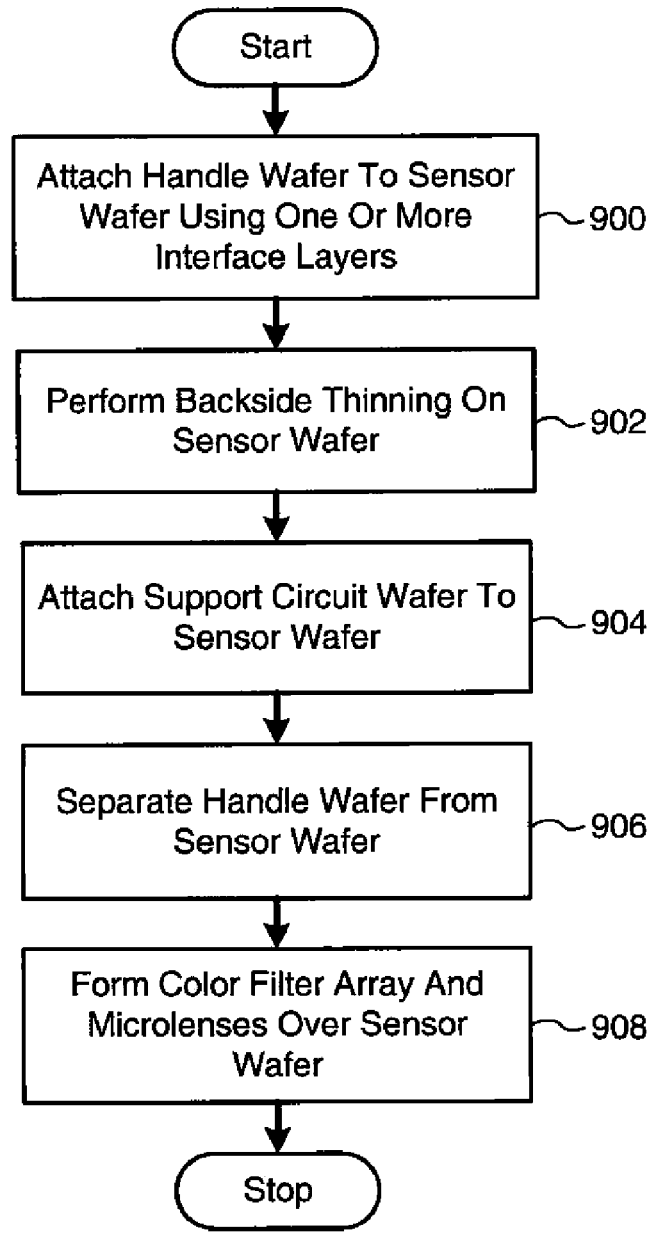
FIG. 9 is a flowchart illustrating a first method for fabricating an image sensor having two semiconductor wafers in an embodiment in accordance with the invention.

Referring now to FIG. 9, there is shown a flowchart illustrating a first method for fabricating an image sensor having two semiconductor wafers in an embodiment in accordance with the invention. A handle wafer is attached to the sensor wafer prior to backside thinning the sensor wafer. The handle wafer and the sensor wafer are connected using one or more interface layers, as shown in block 900. By way of example only, a polymer or organic interface material is used to attach the handle wafer to the sensor wafer. Once the sensor wafer is connected to the handle wafer, the sensor wafer is backside thinned to a given thickness (block 902). The sensor wafer is backside thinned to a thickness of approximately three micrometers or less in an embodiment in accordance with the invention.

The support circuit wafer is then attached to the sensor wafer, as shown in block 904. The support circuit wafer is bonded to the sensor wafer in an embodiment in accordance with the invention. The handle wafer is then separated from the sensor wafer by chemical processing to dissolve the organic or polymer layer (block 906). And finally, a color filter array and microlenses are formed over the sensor wafer, as shown in block 908.

Figure 10:
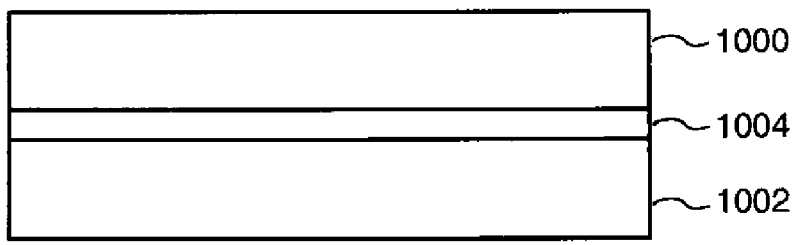
FIG. 10 is a block diagram of a first fabrication system that can be used in conjunction with the method shown in FIG. 9.

FIG. 10 is a block diagram of a first fabrication system that can be used in conjunction with the method shown in FIG. 9. FIG. 10 illustrates the system after block 900 in FIG. 9 is performed. Handle wafer 1000 is attached to sensor wafer 1002 with one or more interface layers 1004. Sensor wafer 1002 is subsequently backside thinned to a given thickness, as shown in block 902 in FIG. 9.

Figure 11:
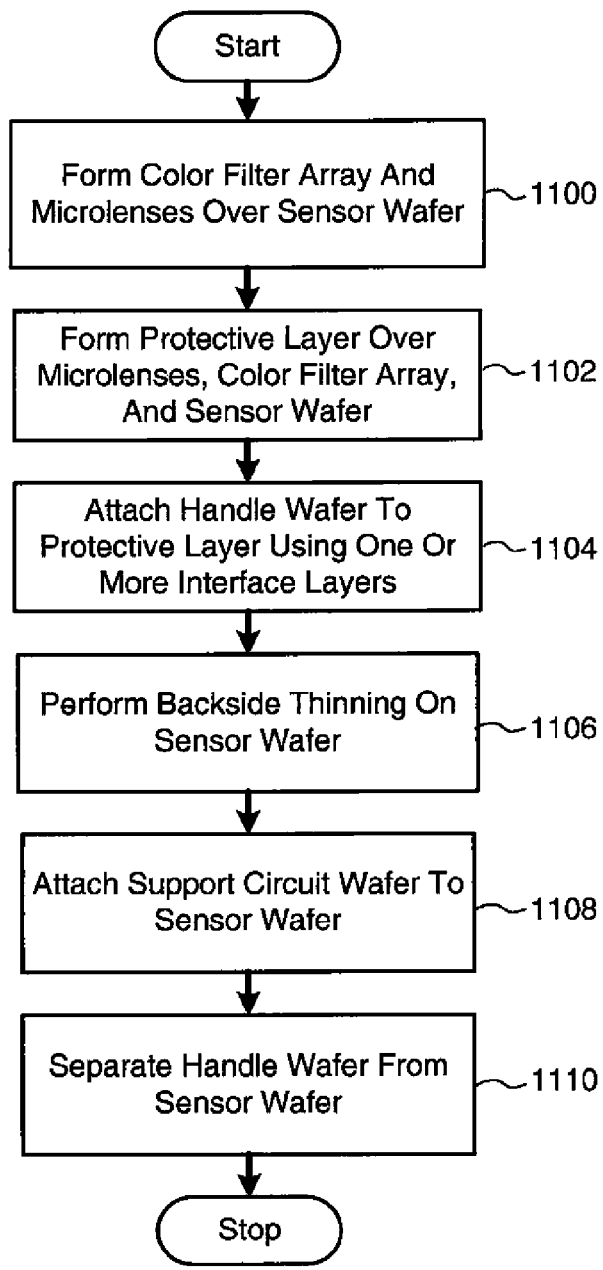
FIG. 11 is a flowchart illustrating a second method for fabricating an image sensor having two semiconductor wafers in an embodiment in accordance with the invention.

Referring now to FIG. 11, there is shown a flowchart illustrating a second method for fabricating an image sensor having two semiconductor wafers in an embodiment in accordance with the invention. Initially a color filter array and microlenses are formed over the sensor wafer, as shown in block 1100. A protective layer analogous to the type of protective layer used in Chip Scale Packaging is then formed over the microlenses, the color filter array, and the sensor wafer (block 1102). Next, at block 1104, the handle wafer is attached to the top of the protective layer using one or more organic or polymer interface layers.

Once the handle wafer is attached to the protective layer, the sensor wafer is backside thinned to a given thickness (block 1106). The support circuit wafer is then attached to the sensor wafer, as shown in block 1108. And finally, the handle wafer is separated from the sensor wafer through chemical processing to dissolve the organic or polymer layer (block 1110).

Figure 12:
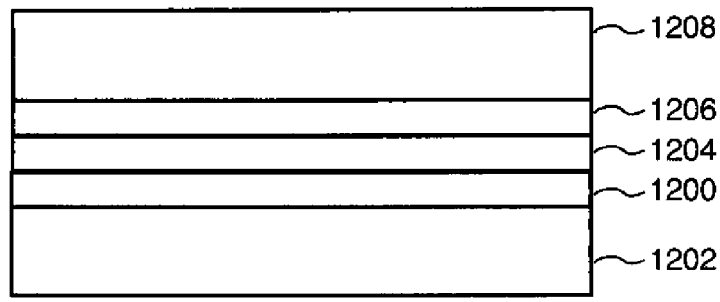
FIG. 12 is a block diagram of a second fabrication system that can be used in conjunction with the method shown in FIG. 11.

FIG. 12 is a block diagram of a second fabrication system that can be used in conjunction with the method shown in FIG. 11. FIG. 12 illustrates a system after blocks 1100, 1102, and 1104 in FIG. 11 have been performed. Color filter array and microlenses 1200 are formed over sensor wafer 1202. Protective layer 1204 is formed over color filter array and microlenses 1200 and sensor wafer 1202. One or more interface layers 1206 is then used to attach handle wafer 1208 to protective layer 1204. Sensor wafer 1202 is subsequently backside thinned to a given thickness, as shown in block 1106 in FIG. 11.

Figure 13:
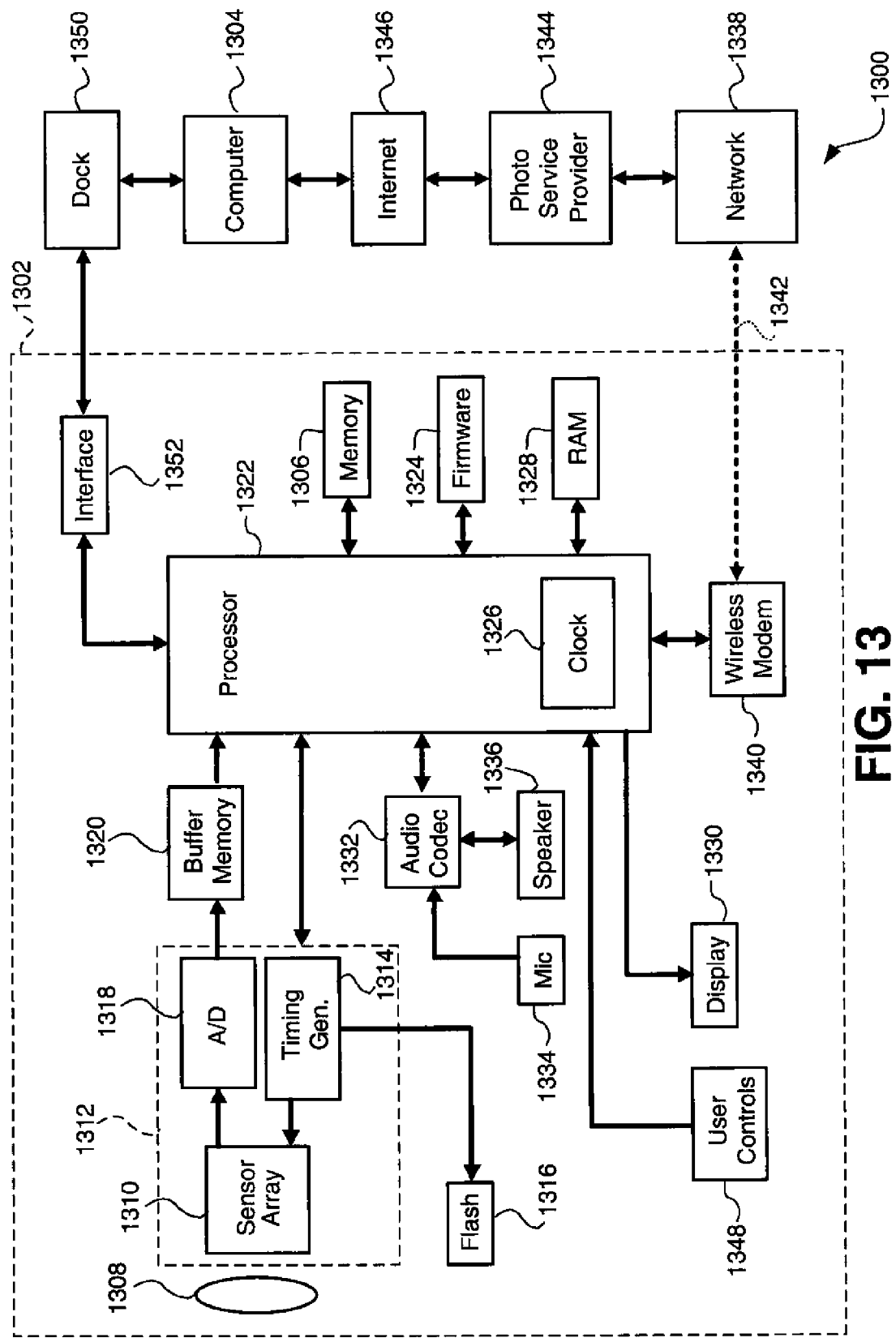
FIG. 13 is a block diagram of an imaging system that can employ an image sensor having two semiconductor wafers in an embodiment in accordance with the invention.

Referring to FIG. 13, there is shown a block diagram of an imaging system that can employ an image sensor having two semiconductor wafers in an embodiment in accordance with the invention. Imaging system 1300 includes digital camera phone 1302 and computing device 1304. Digital camera phone 1302 is an example of an image capture device that can that can employ an image sensor having two semiconductor wafers. Other types of image capture devices can be used with the present invention, such as, for example, digital still cameras and digital video camcorders.

Digital camera phone 1302 is a portable, handheld, battery-operated device in an embodiment in accordance with the invention. Digital camera phone 1302 produces digital images that are stored in memory 1306, which can be, for example, an internal Flash EPROM memory or a removable memory card. Other types of digital image storage media, such as magnetic hard drives, magnetic tape, or optical disks, can alternatively be used to implement memory 1306.

Digital camera phone 1302 uses lens 1308 to focus light from a scene (not shown) onto image sensor array 1310 of active pixel sensor 1312. Image sensor array 1310 provides color image information using the Bayer color filter pattern in an embodiment in accordance with the invention. Image sensor array 1310 is controlled by timing generator 1314, which also controls flash 1316 in order to illuminate the scene when the ambient illumination is low.

The analog output signals output from the image sensor array 1310 are amplified and converted to digital data by analog-to-digital (A/D) converter circuit 1318. The digital data are stored in buffer memory 1320 and subsequently processed by digital processor 1322. Digital processor 1322 is controlled by the firmware stored in firmware memory 1324, which can be flash EPROM memory. Digital processor 1322 includes real-time clock 1326, which keeps the date and time even when digital camera phone 1302 and digital processor 1322 are in a low power state. The processed digital image files are stored in memory 1306. Memory 1306 can also store other types of data, such as, for example, music files (e.g. MP3 files), ring tones, phone numbers, calendars, and to-do lists.

In one embodiment in accordance with the invention, digital camera phone 1302 captures still images. Digital processor 1322 performs color interpolation followed by color and tone correction, in order to produce rendered sRGB image data. The rendered sRGB image data are then compressed and stored as an image file in memory 1306. By way of example only, the image data can be compressed pursuant to the PEG format, which uses the known "Exif" image format. This format includes an Exif application segment that stores particular image metadata using various TIFF tags. Separate TIFF tags can be used, for example, to store the date and time the picture was captured, the lens f/number and other camera settings, and to store image captions.

Digital processor 1322 produces different image sizes that are selected by the user in an embodiment in accordance with the invention. One such size is the low-resolution "thumbnail" size image. Generating thumbnail-size images is described in commonly assigned U.S. Pat. No. 5,164,831, entitled "Electronic Still Camera Providing Multi-Format Storage Of Full And Reduced Resolution Images" to Kuchta, et al. The thumbnail image is stored in RAM memory 1328 and supplied to display 1330, which can be, for example, an active matrix LCD or organic light emitting diode (OLED). Generating thumbnail size images allows the captured images to be reviewed quickly on color display 1330.

In another embodiment in accordance with the invention, digital camera phone 1302 also produces and stores video clips. A video clip is produced by summing multiple pixels of image sensor array 1310 together (e.g. summing pixels of the same color within each 4 column×4 row area of the image sensor array 1310) to create a lower resolution video image frame. The video image frames are read from image sensor array 1310 at regular intervals, for example, using a 15 frame per second readout rate.

Audio codec 1332 is connected to digital processor 1320 and receives an audio signal from microphone (Mic) 1334. Audio codec 1332 also provides an audio signal to speaker 1336. These components are used both for telephone conversations and to record and playback an audio track, along with a video sequence or still image.

Speaker 1336 is also used to inform the user of an incoming phone call in an embodiment in accordance with the invention. This can be done using a standard ring tone stored in firmware memory 1324, or by using a custom ring-tone downloaded from mobile phone network 1338 and stored in memory 1306. In addition, a vibration device (not shown) can be used to provide a silent (e.g. non-audible) notification of an incoming phone call.

Digital processor 1322 is connected to wireless modem 1340, which enables digital camera phone 1302 to transmit and receive information via radio frequency (RF) channel 1342. Wireless modem 1340 communicates with mobile phone network 1338 using another RF link (not shown), such as a 3GSM network. Mobile phone network 1338 communicates with photo service provider 1344, which stores digital images uploaded from digital camera phone 1302. Other devices, including computing device 1304, access these images via the Internet 1346. Mobile phone network 1338 also connects to a standard telephone network (not shown) in order to provide normal telephone service in an embodiment in accordance with the invention.

A graphical user interface (not shown) is displayed on display 1330 and controlled by user controls 1348. User controls 1348 include dedicated push buttons (e.g. a telephone keypad) to dial a phone number, a control to set the mode (e.g. "phone" mode, "calendar" mode" "camera" mode), a joystick controller that includes 4-way control (up, down, left, right) and a push-button center "OK" or "select" switch, in embodiments in accordance with the invention.

Dock 1350 recharges the batteries (not shown) in digital camera phone 1302. Dock 1350 connects digital camera phone 1302 to computing device 1304 via dock interface 1352. Dock interface 1352 is implemented as wired interface, such as a USB interface, in an embodiment in accordance with the invention. Alternatively, in other embodiments in accordance with the invention, dock interface 1352 is implemented as a wireless interface, such as a Bluetooth or an IEEE 802.11b wireless interface. Dock interface 1352 is used to download images from memory 1306 to computing device 1304. Dock interface 1352 is also used to transfer calendar information from computing device 1304 to memory 1306 in digital camera phone 1302.

PARTS LIST 100 image sensor
102 pixel region
104 perimeter inter-wafer connectors
202 sensor wafer
204 support circuit wafer
206 wafer layer
208 epitaxial layer
210 pixel region
212 pixel region
214 pixel region
216 photodetector
218 transfer gate
220 charge-to-voltage conversion mechanism
222 isolation region
224 interconnect layer
226 CMOS device layer
228 metal layer
230 metal layer
232 metal layer
234 metal layer
235 inter-wafer connector
236 support circuitry
238 support circuitry
240 support circuitry
242 inter-wafer connector
244 isolation
246 color filter
248 color filter
250 color filter
252 microlens
300 active pixel
302 reset gate transistor
304 potential $V_{DD}$
306 source follower amplifier transistor
308 row select transistor
310 output
312 dashed line
314 inter-wafer connector
316 node
402 output of transfer gate driver
404 transfer gate interconnect
405 transfer gate contact
406 transfer gate
408 transfer gate
410 pixel region
412 pixel region
500 photodetector
502 transfer gate
504 charge-to-voltage conversion mechanism
506 photodetector
508 transfer gate
510 charge-to-voltage conversion mechanism
512 pixel region
514 pixel region
516 node
518 source follower amplifier transistor
520 reset gate transistor
522 potential $V_{DD}$
524 row select transistor
526 output
600 pixel region
602 pixel region
604 pixel region
606 photodetector
608 transfer gate
610 charge-to-voltage conversion mechanism
612 inter-wafer connector
614 inter-wafer connector
616 inter-wafer connector
618 bin select transistor
620 bin select transistor
700 image sensor
702 sensor wafer
704 support circuit wafer
706 epitaxial layer
708 pixel region
710 pixel region
712 pixel region
714 photodetector
716 transfer gate
718 charge-to-voltage conversion mechanism
720 isolation region
722 interconnect layer
724 interconnect layer
726 CMOS device layer
728 metal layer
730 metal layer
732 metal layer
734 metal layer
736 support circuitry
738 support circuitry
740 support circuitry
742 inter-wafer connector
744 wafer-to-wafer contact
746 input/output connector
748 output for a transfer gate driver
750 bond pad
752 inter-wafer connector
754 surface
800 image sensor
802 sensor wafer
804 support circuit wafer
806 pixel array
808 inter-wafer connector wires 1000 handle wafer
1002 sensor wafer
1004 interface layer
1200 microlenses and color filter array
1202 sensor wafer
1204 protective layer
1206 interface layer
1208 handle wafer
1300 imaging system
1302 camera phone
1304 computing device
1306 memory
1308 lens
1310 image sensor array
1312 active pixel sensor
1314 timing generator
1316 flash
1318 analog-to-digital converter
1320 buffer memory
1322 digital processor
1324 firmware memory
1326 clock
1328 RAM memory
1330 display
1332 audio codec
1334 microphone
1336 speaker
1338 mobile phone network
1340 wireless modem
1342 RF channel
1344 photo service provider
1346 interne
1348 user controls
1350 dock
1352 dock interface

The invention claimed is:

1. An active pixel sensor comprising:
(a) a sensor wafer including:
an array of active pixel regions, each active pixel region including:
photodetector for collecting charge in response to light;
readout circuitry for reading charge from the photodetector; and
two or more interconnects connected to the readout circuitry, wherein each interconnect in the two or more interconnects is connected to corresponding readout circuitry in at least one other active pixel region in the array;
(b) a support circuit wafer connected to the sensor wafer, wherein the support circuit wafer includes:
support circuitry for the array of active pixel regions; and
a plurality of interconnects connected to the support circuitry; and
(c) a plurality of inter-wafer connector wires for transferring control and timing signals from the support circuit wafer to the sensor wafer and column output signals from the sensor wafer to the support circuit wafer, wherein each inter-wafer connector wire is connected between at least one interconnect on the sensor wafer and a corresponding interconnect on the support circuit wafer, and wherein the plurality of inter-wafer connector wires are distributed throughout an area of the active pixel sensor.

2. The active pixel sensor of claim 1, wherein the sensor wafer comprises a back-side illuminated sensor wafer.

3. The active pixel sensor of claim 1, wherein the sensor wafer comprises a front-side illuminated sensor wafer.

4. The active pixel sensor of claim 1, wherein the readout circuitry comprises:
a charge-to-voltage conversion mechanism; and
a transfer gate disposed between the photodetector and the charge-to-voltage conversion mechanism for transferring the charge from the photodetector to the charge-to-voltage conversion mechanism, wherein one of the two or more interconnects is connected to the transfer gate.

5. The active pixel sensor of claim 1, wherein the readout circuitry comprises:
a charge-to-voltage conversion mechanism;
a transfer gate disposed between the photodetector and the charge-to-voltage conversion mechanism for transferring the charge from the photodetector to the charge-to-voltage conversion mechanism; and
a transistor connected to the charge-to-voltage conversion mechanism, wherein one of the two or more interconnects is connected to the transistor.

6. An active pixel sensor comprising:
(a) a sensor die including:
an array of active pixel regions, each active pixel region including:
a photodetector for collecting charge in response to light;
readout circuitry for reading charge from the photodetector; and
two or more interconnects connected to the readout circuitry, wherein each interconnect in the two or more interconnects is connected to corresponding readout circuitry in at least one other active pixel region in the array;
(b) a support circuit die connected to the sensor die, wherein the support circuit die includes:
support circuitry for the array of active pixel regions; and
a plurality of interconnects connected to the support circuitry; and
(c) a plurality of inter-wafer connector wires for transferring control and timing signals from the support circuit die to the sensor die and column output signals from the sensor die to the support circuit die, wherein each inter-wafer connector wire is connected between at least one interconnect on the sensor die and a corresponding interconnect on the support circuit die, and wherein the plurality of inter-wafer connector wires are distributed throughout an area of the active pixel sensor.

7. The active pixel sensor of claim 6, wherein the sensor die comprises a back-side illuminated sensor die.

8. The active pixel sensor of claim 6, wherein the sensor die comprises a front-side illuminated sensor die.

9. The active pixel sensor of claim 6, wherein the readout circuitry comprises:
a charge-to-voltage conversion mechanism; and
a transfer gate disposed between the photodetector and the charge-to-voltage conversion mechanism for transferring the charge from the photodetector to the charge-to-voltage conversion mechanism, wherein one of the two or more interconnects is connected to the transfer gate.

10. The active pixel sensor of claim 6, wherein the readout circuitry comprises:
a charge-to-voltage conversion mechanism;
transfer gate disposed between the photodetector and the charge-to-voltage conversion mechanism for transferring the charge from the photodetector to the charge-to-voltage conversion mechanism; and
a transistor connected to the charge-to-voltage conversion mechanism, wherein one of the two or more interconnects is connected to the transistor.

* * * * *